United States Patent
Nogi

[11] Patent Number: 6,061,227
[45] Date of Patent: May 9, 2000

[54] MULTILAYER LC COMPLEX COMPONENT

[75] Inventor: Kenichiro Nogi, Shibukawa, Japan

[73] Assignee: Taiyo Yuden Co., Ltd., Tokyo, Japan

[21] Appl. No.: 09/106,768

[22] Filed: Jun. 30, 1998

[30] Foreign Application Priority Data

Jun. 30, 1997 [JP] Japan .................................. 9-189111

[51] Int. Cl.[7] ............................. H01G 4/005; H03H 7/00
[52] U.S. Cl. .................. 361/303; 361/306.1; 361/306.3; 333/185
[58] Field of Search .................................. 361/301.4, 302, 361/303, 306.1, 306.3, 308.3, 309, 313, 321.1, 321.2; 333/181–185; 336/200

[56] References Cited

U.S. PATENT DOCUMENTS

| 4,904,967 | 2/1990 | Morii et al. ............................. | 333/185 |
| 5,450,278 | 9/1995 | Lee et al. ................................. | 361/303 |

FOREIGN PATENT DOCUMENTS

| 63-300593 | 12/1988 | Japan . |
| 3-274814 | 12/1991 | Japan . |
| 4-257112 | 9/1992 | Japan . |
| 5-145239 | 6/1993 | Japan . |

*Primary Examiner*—Kristine Kincaid
*Assistant Examiner*—Anthony Dinkins
*Attorney, Agent, or Firm*—McDermott, Will & Emery

[57] ABSTRACT

The object of the present invention is to provide a multilayer LC complex component which is capable of improving reliability by reducing frequency of cracks and achieving better strength, especially resistance against flexure thereof. In an embodiment of the present invention, two patterns of conductors for capacitor R1 and R2 are stacked alternately, and conductors for capacitor R1 are connected to each other through via holes R3 and R4. Capacitor 30 is connected to inductor 12 through via hole D3 which passes through aperture R5 formed in conductor for capacitor R2. As there are plural pillars of via hole formed in the right, left and central part of the present invention, this structure achieves improvement of strength of the central part thereof wherein most of stresses caused by flexure and bending concentrate.

8 Claims, 7 Drawing Sheets

MULTILAYER LC COMPLEX COMPONENT

FIELD OF THE INVENTION

The present invention relates to a multilayer LC complex component comprising an inductor and a capacitor. More specifically, the present invention relates to improvement of the hole-contact thereof.

BACKGROUND OF THE INVENTION

A multilayer LC complex component used in electronic circuits such as a high-frequency filter has such structures described in FIG. 6 and FIG. 7. FIG. 6(A) is a cross-section of a multilayer component of this kind, FIG. 6(B) is an exterior perspective view thereof and FIG. 6(C) is an equivalent circuit thereof. FIG. 7 is an exploded perspective view illustrating the state of the layers thereof. The background art of this kind, as described in FIG. 6(C), is an example of an LC complex component composing a so-called T-shaped filter. As described in FIG. 7, upper half ten layers comprise capacitor 10, and lower half six layers comprise inductor 12. Sheets A1 through A10 which comprise capacitor 10 are made of for example, dielectric substance, therein sheets A2 through A9 comprise a conductor for said capacitor.

Sheets B1 through B6 which comprise inductor 12 are made of, for example, magnetic substance, therein sheets B2 through B5 comprise a conductor for said inductor. A multilayer LC complex component is a multilayer substance which is produced by laminating, molding, pressing and firing those said sheets, and by forming terminal electrodes for external extension for said multilayer substance.

Next, each part of said multilayer LC complex component will be described with reference to the accompanying drawings. First of all, the explanation about capacitor 10 will be given. Sheet A1 is a protective layer. Conductor for capacitor D1 is formed on each of sheets A2, A4, A6, and A8. Conductor for capacitor D2 is formed on each of sheets A3, A5, A7, and A9. Said conductor for capacitor D2, a part of both front and rear side thereof is extended so as to be exposed on the surface of a multilayer LC complex component, is connected to GND electrode 14(side-mounted terminal) described in FIG. 6(B). Each of conductors for capacitor D1 is connected to one another through via hole D3 (indicated by contact lines) around the central part thereof: In other words, each of the said conductor for capacitor D2 has an aperture in the center thereof and through via hole D3 which passes through said apertures, each of the said conductor for capacitor D1 is connected to one another. Sheet A10 is a protective layer.

As described above, two patterns of conductors for capacitor D1 and D2 are alternately stacked, and each of the conductor for capacitor D1 is connected to one another through via hole D3. Capacitor C indicated in FIG. 6(C) is comprised of said conductors for capacitor D1 and D2.

Secondly, referring to FIG. 6 and FIG. 7, the explanation of inductor 12 will be given. Sheet B1 is a protective layer. On sheet B2, conductor for inductor E1 is formed for connecting inductor 12 to said capacitor 10. Said conductor for inductor E1 is connected to said capacitor 10 through via hole D3 which passes through sheet B1. On sheet B3, U-shaped conductors for inductor F1 and G1 are formed so that the openings thereof are facing with each other. One end of each of said conductors for inductor F1 and G1 is connected respectively to each end of conductor for inductor E1 through via holes F2 and G2.

On sheet B4, U-shaped conductors for inductor F3 and G3 are formed so that they are facing in opposite directions. One end of each of said conductors for inductor F3 and G3 is connected to conductor for inductor F1 and G1 respectively through via hole F4 and G4. On both ends of sheet B5, L-shaped conductors for inductor F5 and G5 are formed, so that the end of the extended part thereof is exposed on the surface of said multilayer complex component. One end of each of conductors for inductor F5 and G5 is connected to conductors for inductor F3 and G3 respectively through via holes F6 and G6. The bottom sheet B6 is a protective layer.

Of parts described above, conductors for inductor E1, F1, F3 and F5, and via holes F2, F4, and F6, all of which are connected so as to form a spiral shape, compose inductor LA indicated in FIG. 6(C). Conductors for inductor E1, G1, G3, and G5, and via holes G2, G4, and G6, all of which are connected so as to form a spiral shape, compose inductor LB indicated in FIG. 6(C). Conductors for inductor F5 and G5 on sheet B5, which are exposed at both ends on the surface of said multilayer component, are connected respectively to input/output electrodes 16 and 18 indicated in FIG. 6(B) and (C).

Said sheets, whereon said conductors for capacitor, said conductors for inductor, or said via holes are formed as described above, are stacked in the order indicated in FIG. 7, whereafter they are molded, pressed and burnt into a multilayer substance. By forming electrodes on front, rear, right, and left ends thereof, a multilayer LC complex component is produced. FIG. 6(B) is an exterior view thereof, providing a shape of rectangular parallelopiped. On both end planes of the longer plane thereof, input/output electrodes 16 and 18 are formed. Each of GND electrodes 14 are formed on the front and rear planes thereof. FIG. 6(A) is a cross-sectional elevation view of FIG. 6(B) which is seen in the direction of arrows along with line #6. As indicated in FIG. 6(A), via hole D3 provides a pillar shape in the central part of said multilayer substance, whereby an inductor device is connected to a capacitor device inside of said multilayer substance.

This background technology, however, causes deterioration of strength of said multilayer substance at this central part because via holes connected in series provide a straight pillar shape in the central part thereof. Especially, in such a case where a flexible substrate is used for on-board mounting, correspondingly large stress will possibly be exerted on said multilayer substance because the substrate itself is bent or warped. In more detailed description, an LC complex component mounted onto a substrate is soldered at both ends and at a side thereof. Therefore, the stress exerted by bending said substrate concentrates on the central part of the LC complex component. When there is a hole-contact in the center thereof, the part of hole contact is susceptible to cracking because a conductor filled inside of the hole has less resistance against bending than ceramic material around said conductor. A crack of said multilayer substance will permit entry of moisture inside thereof. This may deteriorate the quality thereof in such terms as moisture resistance.

SUMMARY OF THE INVENTION

It is an object of the present invention to provide a multilayer LC complex component which is capable of improving reliability, and has improved strength, especially resistance against bending thereof so as to reduce frequency of occurrence of cracks.

To accomplish the object described above, the characteristic aspects of an embodiment of the present invention reside in: that an embodiment of the present invention comprises a capacitor and an inductor; that appropriate conductors for capacitor of an embodiment of the present invention are connected through hole-contact; and that an embodiment of the present invention, wherein a capacitor and an inductor are connected through hole-contact, has plural parts of hole-contact by dividing the part of said hole-contact into plural numbers and forming them at different parts.

The above and other objects, features and advantages of the present invention will become apparent from the following detailed description taken with the accompanying drawings.

DETAILED DESCRIPTION OF THE PREFERRED EMBODIMENTS OF THE PRESENT INVENTION

The present invention is susceptible of numerous physical embodiments, depending upon the environment and requirements of use, substantial numbers of the herein shown and described embodiments have been made, tested and used, and all have performed in an eminently satisfactory manner.

(1) Embodiment 1

Figure 1:
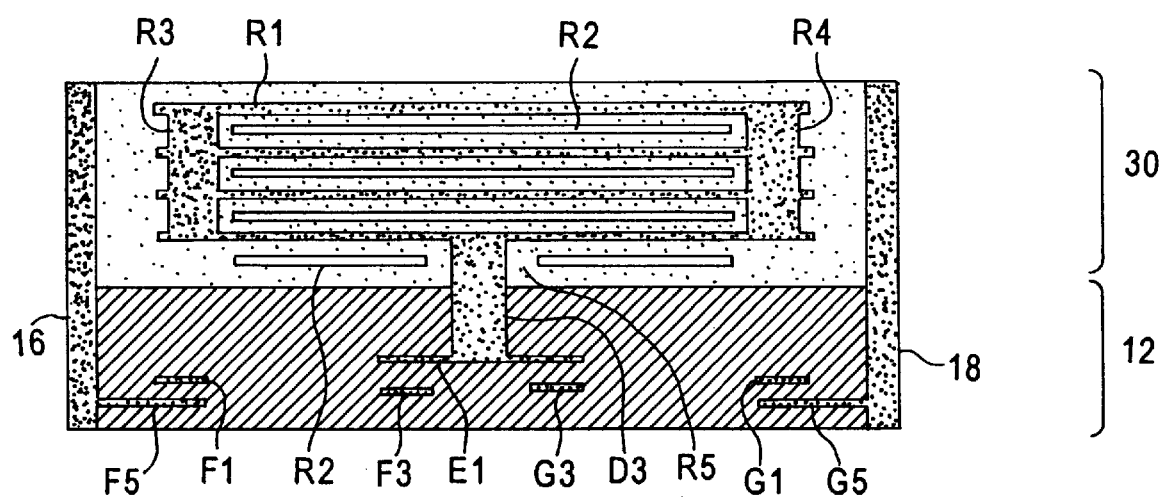
FIG. 1 is a vertical view of embodiment 1 of the present invention.
Figure 2:
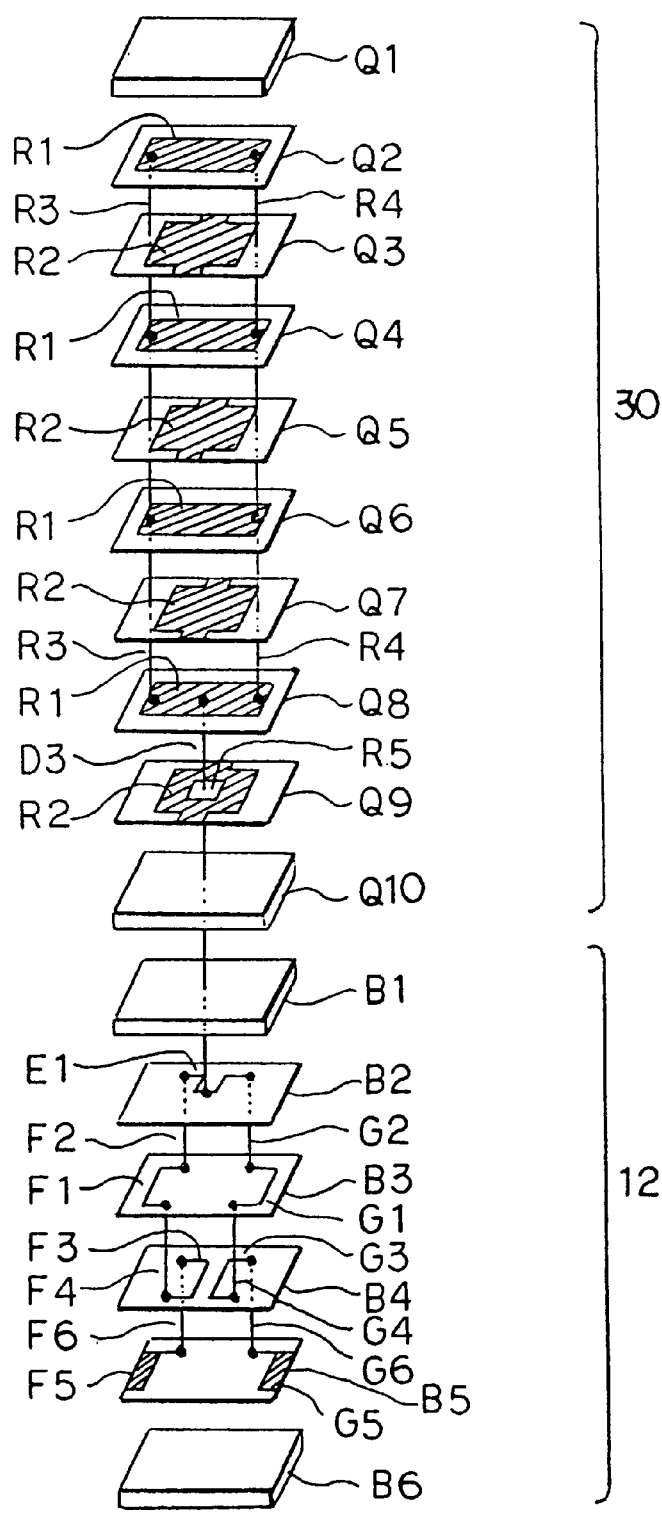
FIG. 2 is an exploded perspective view showing the multilayer structure of embodiment 1 of the present invention.

Referring to FIG. 1 and FIG. 2, the explanation about embodiment 1 will be given. First of all, referring to FIG. 2, the multilayer structure of embodiment 1 will be explained. In FIG. 2, the upper half ten layers comprise capacitor 30, and the lower half six layers comprise inductor 12. Sheets Q1 through Q10 are made of such materials as dielectric substance, wherein on each of sheets Q2 through Q9 conductors for capacitor is formed. Inductor 12 has the same structure as that of the background art described above. By stacking, molding, pressing, and firing said sheets to form a multilayer component, whereon terminal electrodes for external extension are formed, a multilayer LC complex component is produced.

Figure 6A:
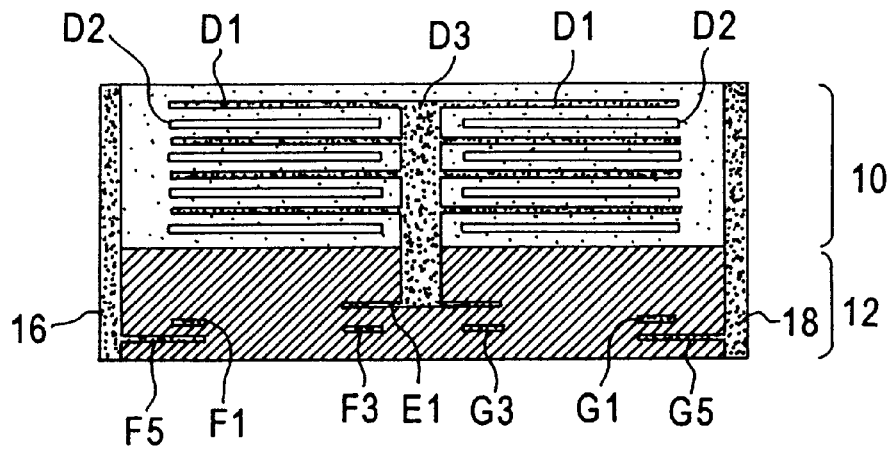
FIGS. 6(A), (B), and (C) are respectively a vertical view, an exterior view, and a diagram showing an equivalent circuit of the background art.
Figure 6B:
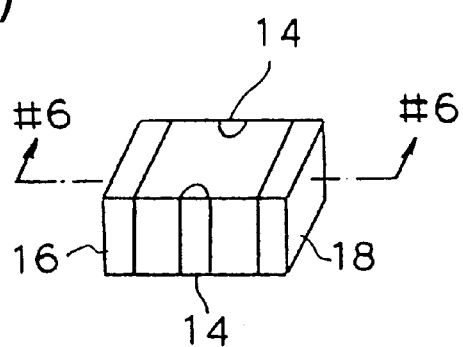

Next, referring to FIG. 2, detailed description of capacitor 30 will be given. Sheet Q1 is a protective layer. On each of sheets Q2, Q4, Q6, and Q8, conductor for capacitor R1 is formed. On each of sheets Q3, Q5, Q7, and Q9, conductor for capacitor R2 is formed. Each of conductor for capacitor R2 has extended parts towards the front and rear thereof that are exposed to the surface of said multilayer component and connected to GND electrodes 14 described in FIG. 6(B). Conductors for capacitor R1 are connected to one another respectively through via holes R3 and R4 (indicated by connecting line) at near to right end and left end thereof. In other words, conductor for capacitor R2 has narrower width than that of the background art described above. Each of conductor for capacitor R1 is connected to one another through via holes R3 and R4, each thereof passing through near left and right ends of conductor for capacitor R1 respectively. Sheet Q10 is a protective layer.

Figure 6C:
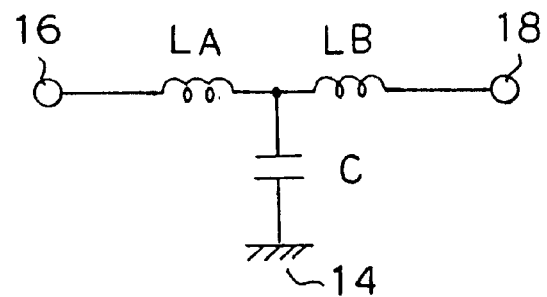
Figure 7:
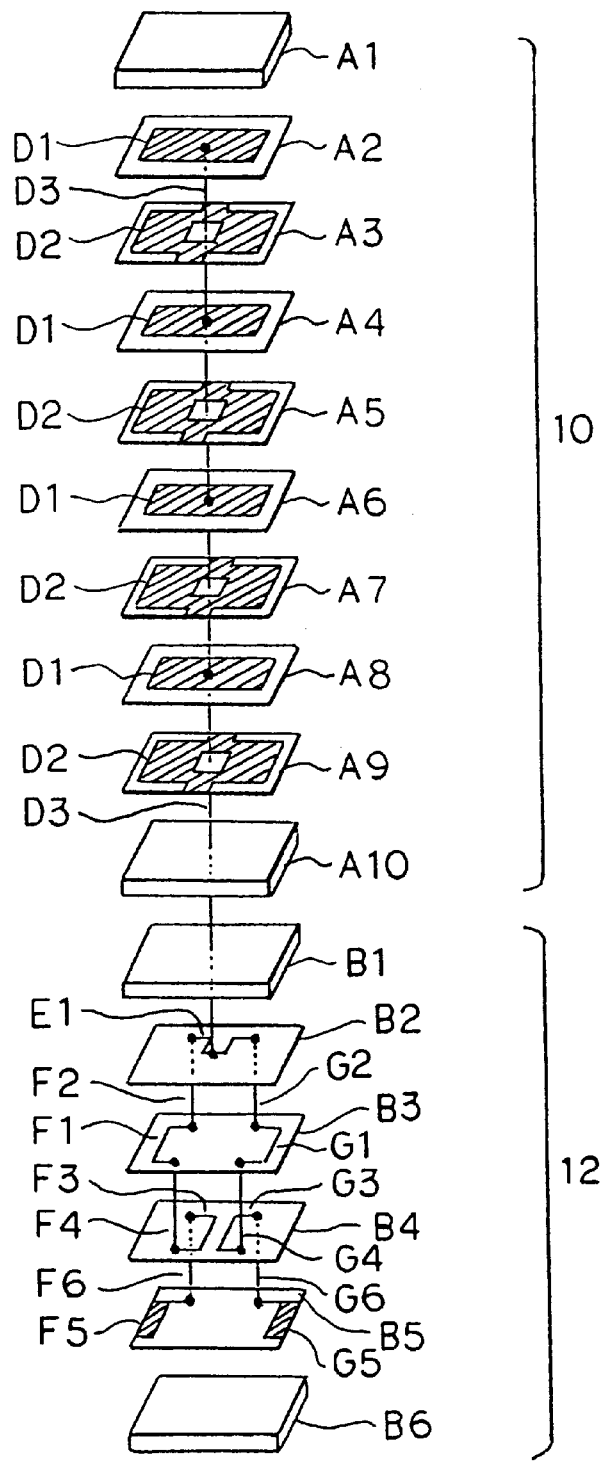
FIG. 7 is an exploded perspective view showing the multilayer structure of the background art.

As described above, two types of conductors for capacitor R1 and R2 are stacked alternately, and conductors for capacitor R1 are connected to one another through via holes R3 and R4. Capacitor C described in FIG. 6(C) is comprised of said conductors for capacitor R1 and R2. Conductor for capacitor R1 formed on sheet Q8 and inductor 12 are connected through via hole D3. For the purpose of this contact, conductor for capacitor R2 formed on sheet Q9 has an aperture R5 which is used as via hole D3.

FIG. 1 is a vertical view of a complex component which has multilayer structure described above. As described in FIG. 1, in embodiment 1, each of conductor for capacitor R1 is connected to one another through via holes R3 and R4 at both ends thereof, and conductor 30 is connected to inductor 12 through via hole D3 formed at the center of embodiment 1. Therefore, embodiment 1 has a structure wherein there are three pillars of via hole formed right, center, and left thereof. This structure of embodiment 1 can increase resistance of the central part of embodiment 1 wherein most stresses caused by bending and flexure concentrate. Therefore, frequency of cracks will be decreased in such a case where it is mounted on a flexible substrate, and this structure is capable of improving reliability thereof. This structure is also capable of improving certainty of contact between conductors for capacitor R1 because they are connected through plural via holes R3 and R4.

(2) Embodiment 2

Figure 3A:
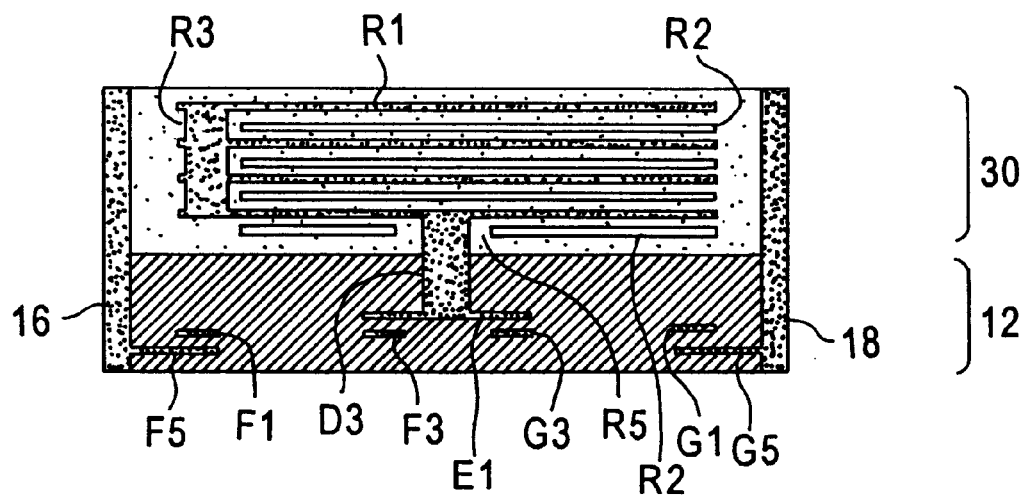
FIGS. 3(A) and (B) are vertical views showing embodiment 2 and embodiment 3 of the present invention respectively.

Next, referring to FIG. 3(A), embodiment 2 will be described. Embodiment 2 is an improvement of embodiment 1. As described in a vertical view in FIG. 3(A), embodiment 2 has structure wherein one of via holes R3 and R4 is omitted (e.g. Via hole R4 is omitted in FIG. 3(A)). This embodiment is also capable of improving the resistance against stress as in the case of embodiment 1 described above, because it also has plural pillars of via hole.

(3) Embodiment 3

Figure 3B:
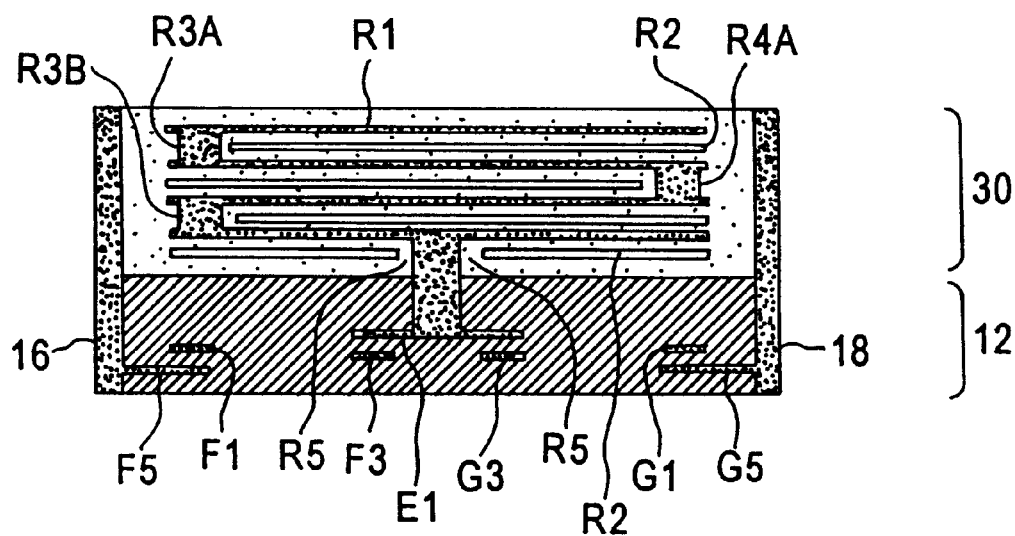

Thirdly, embodiment 3 described in FIG. 3(B) has via holes R3 and R4 formed in alternate interlayers between conductors for capacitor R1. With elaborate description in embodiment 3, conductors for capacitor R1 formed on each of sheets Q2 and Q4 are connected to one another through via hole R3A. Conductors for capacitor R1 formed on each of sheets Q4 and Q6 are connected to one another through via hole R4A, and conductors for capacitor R1 formed on each of sheets Q6 and Q8 are connected to one another through via hole R3B. These via holes R3A, R4A, and R3B are formed at right or left ends of a multilayer component alternately. This structure also provides improved resistance against stress because embodiment 3 has plural pillars of via holes.

(4) Embodiment 4

Referring to FIG. 4, embodiment 4 will be described. In all embodiments 1 through 3, only capacitor part thereof has plural pillars of via hole, while in embodiment 4, pillar of via hole is divided into plural parts at the joint part of a capacitor with an inductor. In embodiment 4, pillar of via hole D3 is located in the center of a multilayer component, and inductor 40 thereof has the same structure as the background art described above, except for the joint part of a capacitor with an inductor thereof.

Figure 4A:
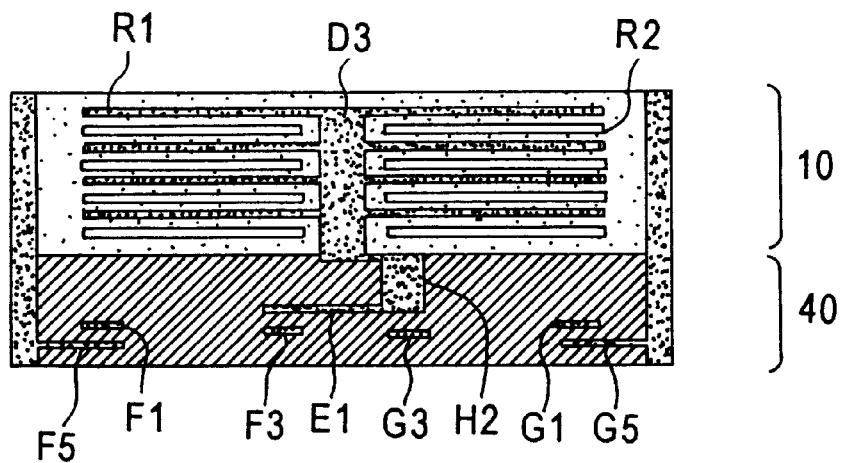
FIG. 4(A) is a vertical view of embodiment 4 of the present invention and FIG. 4(B) is an exploded perspective view showing the principal part of the multilayer structure of embodiment 4 of the present invention.
Figure 4B:
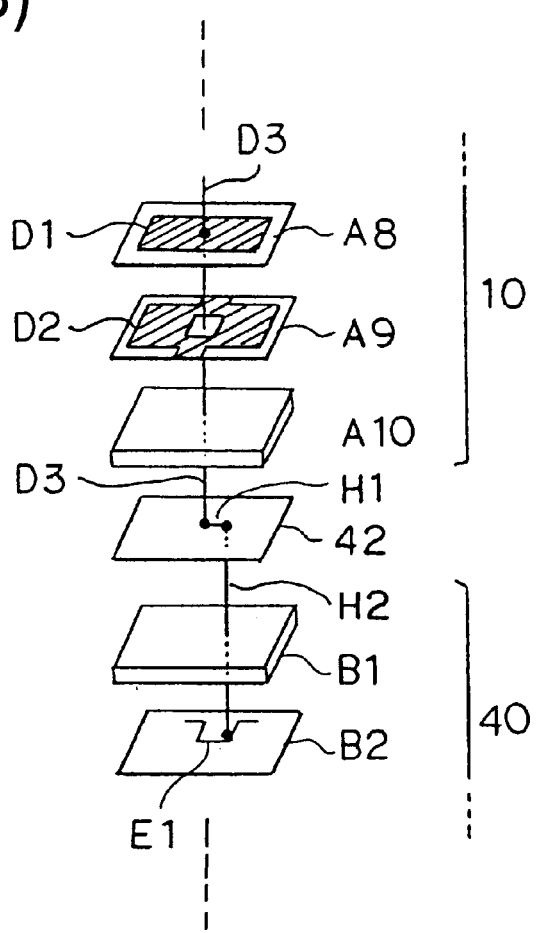

As described in FIG. 4(B) illustrating the principle part of a multilayer structure, what makes different embodiment 4 from the background art described above is an intermediate sheet 42 formed between capacitor 10 and inductor 40, whereon connective conductor H1 is formed. Via hole D3 formed in capacitor 10 is connected to one end of connective conductor H1. The other end of connective conductor H1 is contacted to conductor for inductor E1 formed in inductor 40 through via hole H2.

Therefore, embodiment 4 has a vertical view thereof as described in FIG. 4(A), wherein via holes D3 formed in capacitor 10 and via hole H2 formed in inductor 40 do not comprise one pillar, but are divided into plural parts. This structure achieves improvement of resistance against stress and decrease of frequency of cracks in such a manner described in embodiments 3.

(5) Actual examples of preferred embodiments of the present invention

Next, an experiment using actual examples of the preferred embodiments described above will be provided. In this experiment, sample multilayer LC complex components of each embodiment of the present invention described above will be made and used. Referring to FIG. 1, each sample component is 2.00 mm wide, 1.25 mm high, and 1.25 mm depth dimension. Thirty sample components of each embodiment will be prepared.

Figure 5:
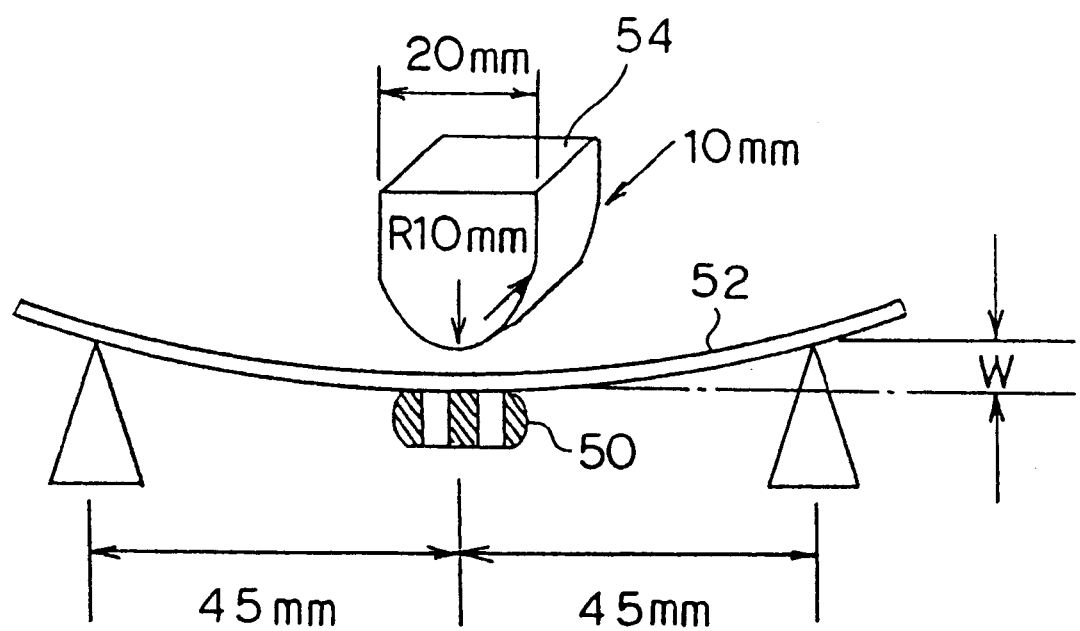
FIG. 5 is a schematic view showing flexure experiment.

Each sample component will be subject to a flexure experiment implemented in a manner described in FIG. 5. As described in FIG. 5, sample component 50 is mounted on substrate 52. Substrate 52 is supported at points 45 mm apart from sample component 50 whereon flexure stress is exerted by using weight 54. Then, it is confirmed whether sample component 50 has cracks inside thereof. Weight 54 is 20 mm wide and 10 mm long, and has 10 mm curvature at the contact point with substrate 52.

The flexure experiment described above was implemented for each sample component, and the flexure amount W has measured when a sample component had one or more cracks. Thirty sample components in each embodiment of the present invention have been subject to the measurement. The results of the experiments are shown in Table 1. Each figure shown in Table 1 is the minimum result among each thirty results.

TABLE 1

| Flexure amount W to cause one or more cracks to sample component | |
|---|---|
| Embodiment 1 | 6.3 mm |
| Embodiment 2 | 6.8 mm |
| Embodiment 3 | 7.0 mm |
| Embodiment 4 | 4.9 mm |
| Background art | 2.4 mm |

As described in Table 1, in every embodiment of the present invention, the flexure amount W to cause one or more cracks to a sample component is larger than that in the background art. This shows that said embodiments have achieved improvement of the resistance against stress of a multilayer LC complex component. Comparing flexure amounts in all embodiments of the present invention, embodiment 3 shows the largest flexure amount as described in Table 1, which means that this embodiment achieved substantial improvement of the resistance against stress thereof.

The present invention is susceptible to numerous physical embodiments, and substantial numbers of embodiments thereof are capable to be applied based on the disclosure described above. The following may be included as embodiments of the present invention:

(1) In the embodiment of the present invention described in FIG. 3(B), via holes are formed between every two conductors for capacitor connected through hole-contact If an embodiment wherein a pillar of via hole are divided in such a manner different from that of the embodiment described in FIG. 3(B) may be accepted as another embodiment that has another structure different from said embodiment. For example, referring to FIG. 2, an embodiment wherein conductors for capacitor R1 formed on each of sheets Q2, Q4, and Q6 are connected to each other through via hole R3, and conductors for capacitor R1 formed on each of sheets Q6 and Q8 are connected through via hole R4, may be accepted as a different embodiment that has a different structure from that described in FIG. 2

(2) Patterns and numbers of layer in conductor for capacitor and conductor for inductor may be determined arbitrarily. Material for sheets may also be determined arbitrarily. Because materials used for capacitor are different from those used for inductor, an intermediate sheet may be formed between capacitor and inductor for the junction of different materials. In the embodiment described in FIG. 4, intermediate sheet 42 made of substance for junction of different materials is used.

(3) In all of actual examples described above, the present invention is applied to a T-shaped filter. The present invention is also applicable to various types of filter, such as π-shaped filter and double-π-shaped filter.

(4) Combination of embodiments of the present inventions described above may also be applicable. For example, one of embodiment 1 to 3 may be combined with embodiment 4.

As described above, the present invention achieves improvement of strength, especially resistance against flexure of a component, and reduces frequency of cracks, and is capable of improvement of reliability because divided parts of hole-contact are located in dispersed part of a component As many apparently widely different embodiments of this invention may be made without departing from the spirit and scope thereof, it is to be understood that the invention is not limited to the specific embodiments thereof except as defined in the appended claims.

What is claimed is:

1. A multilayer LC complex component comprising;
   a capacitor and an inductor;
   appropriate conductors for capacitor which are connected to each other through hole-contact; and
   a capacitor which is jointed to an inductor through hole-contact,
   a characteristic thereof is that said hole-contact thereof is divided and placed at plural positions thereof.

2. An improvement of claim 1, a characteristic thereof is that said conductors for capacitor are connected to each other through hole-contacts which are located at plural positions thereof.

3. An improvement of claim 2, a characteristic thereof is that hole-contact of conductors for capacitor is divided into two that are formed at both end thereof.

4. An improvement of claim 1, a characteristic thereof is that a hole-contact of conductors for capacitor is divided into plural parts that formed at different positions.

5. An improvement of claim 1, a characteristic thereof is that said hole-contact is divided into two parts: one part for jointing conductors for capacitor; and the other part for connecting capacitor to inductor: and that said two parts of hole-contact are formed at different positions.

6. An improvement of claim 5, a characteristic thereof is that a hole formed in capacitor is connected to a hole formed in inductor through connective conductor formed on an intermediate sheet placed between a multilayer substance wherein a conductor for capacitor is formed and a multilayer substance wherein a conductor for inductor is formed.

7. An improvement of claim 1, a characteristic thereof is that laminated sheets each whereon a conductors for capacitor is formed are made of dielectric material and laminated sheets each whereon a conductor for inductor is formed are made of magnetic material.

8. An improvement of claim 1, a characteristic thereof is that an intermediate sheet made of materials for jointing different substances is formed between laminated sheets each whereon a conductor for capacitor is formed and laminated sheets each whereon a conductor for inductor is formed.

* * * * *